US010504771B2

(12) United States Patent
Kim et al.

(10) Patent No.: US 10,504,771 B2
(45) Date of Patent: Dec. 10, 2019

(54) SEMICONDUCTOR DEVICE INCLUDING STRAINED GERMANIUM AND METHOD FOR MANUFACTURING THE SAME

(71) Applicant: KOREA INSTITUTE OF SCIENCE AND TECHNOLOGY, Seoul (KR)

(72) Inventors: Hyung-Jun Kim, Seoul (KR); Sanghyeon Kim, Seoul (KR); Jae-Phil Shim, Seoul (KR); Yeon-Su Kim, Seoul (KR); Heejeong Lim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/416,727

(22) Filed: Jan. 26, 2017

(65) Prior Publication Data

US 2018/0076084 A1    Mar. 15, 2018

(30) Foreign Application Priority Data

Sep. 13, 2016 (KR) .................. 10-2016-0118034

(51) Int. Cl.
| | |
|---|---|
| *H01L 29/06* | (2006.01) |
| *H01L 29/16* | (2006.01) |
| *H01L 21/762* | (2006.01) |
| *H01L 21/02* | (2006.01) |

(52) U.S. Cl.
CPC .. *H01L 21/76251* (2013.01); *H01L 21/02392* (2013.01); *H01L 21/02463* (2013.01);
(Continued)

(58) Field of Classification Search
CPC ......... H01L 21/76251; H01L 21/02463; H01L 29/0657; H01L 21/02392
See application file for complete search history.

(56) References Cited

U.S. PATENT DOCUMENTS

| | | |
|---|---|---|
| 6,890,835 B1 | 5/2005 | Chu et al. |
| 7,229,898 B2 | 6/2007 | Bourdelle et al. |

(Continued)

FOREIGN PATENT DOCUMENTS

| | | |
|---|---|---|
| EP | 1 928 020 A1 | 6/2008 |
| JP | 2008-141206 A | 6/2008 |

(Continued)

OTHER PUBLICATIONS

Akatsu, T., et al., "Germanium-on-insulator (GeOI) substrates—a novel engineered substrate for future high performance devices," ScienceDirect, Materials science in semiconductor processing, vol. 9.4, 2006, (pp. 444-448).

(Continued)

*Primary Examiner* — Tucker J Wright
*Assistant Examiner* — Wilner Jean Baptiste
(74) *Attorney, Agent, or Firm* — NSIP Law

(57) ABSTRACT

A method for manufacturing a semiconductor device includes: forming a sacrificial layer on a first substrate, the sacrificial layer being made of a material whose lattice constant is different from that of germanium (Ge) by a preset threshold or below; forming a germanium (Ge) layer on the sacrificial layer; forming an insulation layer on a second substrate; bonding the germanium (Ge) layer onto the insulation layer; and removing the sacrificial layer and the first substrate by etching the sacrificial layer in a state where the germanium (Ge) layer is bonded to the insulation layer. In this method, a germanium-on-insulator (GeOI) structure having various surface orientations may be formed by means of epitaxial lift-off (ELO), and a strain may be applied to the germanium (Ge) layer using a lattice constant of the sacrificial layer.

9 Claims, 9 Drawing Sheets

(52) U.S. Cl.
CPC .... *H01L 21/02532* (2013.01); *H01L 29/0649* (2013.01); *H01L 29/0657* (2013.01); *H01L 29/16* (2013.01)

(56) References Cited

U.S. PATENT DOCUMENTS

| | | | |
|---|---|---|---|
| 9,515,073 B1* | 12/2016 | Jagannathan | ......... H01L 21/845 |
| 2003/0077867 A1* | 4/2003 | Fitzgerald | ......... H01L 21/02381 |
| | | | 438/285 |
| 2006/0014363 A1 | 1/2006 | Daval et al. | |
| 2009/0120568 A1 | 5/2009 | Deguet et al. | |
| 2015/0228501 A1* | 8/2015 | Bedell | .................. H01L 21/324 |
| | | | 438/151 |
| 2015/0372455 A1* | 12/2015 | Nam | .................... H01S 5/3223 |
| | | | 372/45.01 |
| 2016/0104819 A1 | 4/2016 | Schmid et al. | |
| 2016/0372607 A1* | 12/2016 | Le | ......................... B82Y 10/00 |

FOREIGN PATENT DOCUMENTS

| | | |
|---|---|---|
| JP | 2014-138097 A | 7/2014 |
| JP | 2014-150248 A | 8/2014 |
| KR | 10-2003-0051714 A | 6/2003 |
| KR | 10-2007-0019697 A | 2/2007 |
| KR | 10-0734239 B1 | 7/2007 |
| KR | 10-2011-0003522 A | 1/2011 |
| KR | 10-2016-0009554 A | 1/2016 |
| WO | WO 2010/000596 A1 | 1/2010 |

OTHER PUBLICATIONS

Mieda, E., et al., "Wafer-scale layer transfer of GaAs and Ge onto Si wafers using patterned epitaxial lift-off," Japanese Journal of Applied Physics, vol. 54.3, 2015 (5 pages).

* cited by examiner

SEMICONDUCTOR DEVICE INCLUDING STRAINED GERMANIUM AND METHOD FOR MANUFACTURING THE SAME

CROSS-REFERENCE TO RELATED APPLICATION

This application claims priority to Korean Patent Application No. 10-2016-118034, filed on Sep. 13, 2016, and all the benefits accruing therefrom under 35 U.S.C. § 119, the contents of which in its entirety are herein incorporated by reference.

BACKGROUND

Field

Embodiments relate to a method for manufacturing a semiconductor device containing strained germanium (Ge) and a semiconductor device manufactured by the same, and more particularly, to a technique for forming a germanium-on-insulator (GeOI) structure by means of epitaxial lift-off (ELO) and applying strain to a germanium (Ge) layer.

[Description about National Research and Development Support]

This study was supported by the R&D Project of Korea Evaluation Institute of Industrial Technology (Project Name: Development of transfer process technology for III-V compound semiconductors MOSFET on silicon substrate and monolithic three-dimensional integrated circuit, Project No. 1711041155) under the superintendence of Ministry of Trade, Industry and Energy, Republic of Korea.

Description of the Related Art

SOITEC in France has developed a silicon-on-insulator (SOI) structure, and the SOI has contributed to improvement of performance of various semiconductor devices. However, a silicon (Si) based devices have faced a difficulty in scaling and thus is expected to reach the limit within several years. For this reason, the interest on a mechanism for developing new semiconducting materials is increasing.

Among new semiconducting materials, germanium (Ge) receives attention as a material of a n-type and p-type metal oxide semiconductor field effect transistor (MOSFET) channel due to higher electron and hole mobility in comparison to silicon (Si), and particularly is regarded as a prominent material of p-MOSFET. Accordingly, it is expected that the demand and interest on the germanium-on-insulator (GeOI) is also rapidly increasing.

In an existing GeOI manufacturing method, an existing SOI manufacturing method has been utilized directly. For example, in a state where hydrogen ions are implanted to a germanium (Ge) substrate or a silicon germanium ($Si_xGe_{1-x}$) buffer layer, the wafer is bonded to a separate silicon (Si) substrate, and then only the germanium (Ge) layer is split. In other case, a silicon germanium ($Si_xGe_{1-x}$) buffer layer is wafer-bonded onto a silicon (Si) substrate, and then grinded to remain the germanium (Ge) layer. In addition, germanium (Ge) condensation or liquid phase epitaxy has also been used.

However, the existing methods for manufacturing GeOI have the following drawbacks. For example, the germanium (Ge) layer serving as an active layer has bad quality, and when hydrogen is implanted, germanium (Ge) may have degraded crystal quality since it is weak against the implanted hydrogen. Also, when a substrate is split using hydrogen bubbles, the germanium (Ge) layer may be damaged due to high-temperature annealing, and due to the high surface roughness of the germanium (Ge) layer, a polishing process is essentially demanded. Moreover, in the existing methods, a process of making the germanium (Ge) layer to have a thickness of several ten nanometers or below has a seriously high level of difficulty, and regarding the surface orientation, it is impossible to manufacture GeOI with an orientation other than (100) surface.

SUMMARY

An aspect of the present disclosure is directed to providing a method for manufacturing a semiconductor device, which may form a germanium-on-insulator (GeOI) in which a germanium (Ge) layer having various surface orientations is located on an insulator by means of epitaxial lift-off (ELO) and also apply a strain to the germanium (Ge) layer, and a semiconductor device manufactured by the method.

A method for manufacturing a semiconductor device according to an embodiment comprises: forming a sacrificial layer on a first substrate, the sacrificial layer being made of a material whose lattice constant is different from that of germanium (Ge) by a preset threshold or below; forming a germanium (Ge) layer on the sacrificial layer; forming an insulation layer on a second substrate; bonding the germanium (Ge) layer onto the insulation layer; and removing the sacrificial layer and the first substrate by etching the sacrificial layer in a state where the germanium (Ge) layer is bonded to the insulation layer. At this time, a strain determined based on a difference in lattice constant between the germanium (Ge) layer and the sacrificial layer is applied to the germanium (Ge) layer.

In an embodiment, the preset threshold may be 5/100 of the lattice constant of germanium (Ge).

In an embodiment, the sacrificial layer may include any material selected from the group consisting of aluminum phosphate (AlP), gallium phosphate (GaP), gallium aluminum phosphate (GaAlP), silicon (Si), aluminum arsenide (AlAs), gallium arsenide (GaAs), indium gallium arsenide (InGaAs), indium phosphide (InP), indium aluminum arsenide (InAlAs), and combinations of two or more thereof.

In an embodiment, the sacrificial layer may be made of indium aluminum arsenide (InAlAs), and a magnitude of the strain applied to the germanium (Ge) layer may be determined according to compositions of indium (In) and aluminum (Al) in the sacrificial layer.

The method for manufacturing a semiconductor device according to an embodiment may further comprise patterning the sacrificial layer and the germanium (Ge) layer into a predetermined shape, before bonding the germanium (Ge) layer onto the insulation layer.

In an embodiment, the predetermined shape may have a plurality of strip shapes extending in one direction, and a uniaxial strain may be applied to the germanium (Ge) layer.

In an embodiment, the predetermined shape may have a plurality of square shaped patterns arranged in a two-dimensional array, and a biaxial strain may be applied to the germanium (Ge) layer.

In an embodiment, the first substrate may be made of III-V compound semiconductors, and the sacrificial layer may be formed on the first substrate by means of epitaxy growth.

In an embodiment, the second substrate may be made of silicon.

In another aspect, there is provided a semiconductor device, comprising: an insulation layer located on a substrate; and a germanium (Ge) layer located on the insulation layer, wherein the germanium (Ge) layer grows on a sacrificial layer, made of a material whose lattice constant is different from that of germanium (Ge) by a preset threshold or below, so that a strain corresponding to a difference in lattice constant between the germanium (Ge) layer and the sacrificial layer is applied to the germanium (Ge) layer.

In an embodiment, the germanium (Ge) layer may be patterned into a predetermined shape. For example, the predetermined shape may have a plurality of strip shapes extending in one direction, and a uniaxial strain may be applied to the germanium (Ge) layer. In other case, the predetermined shape may have a plurality of square shaped patterns arranged in a two-dimensional array, and a biaxial strain may be applied to the germanium (Ge) layer.

In the semiconductor device according to an embodiment, the substrate may be made of silicon.

According to the method for manufacturing a semiconductor device according to an embodiment of the present disclosure, it is possible to form a germanium-on-insulator (GeOI) in which a germanium (Ge) layer having various surface orientations is located on an insulator by means of epitaxial lift-off (ELO). Since germanium (Ge) has high charge mobility in surface orientations (110) and (111) in comparison to (100), the performance of a semiconductor device may be maximized by forming a germanium (Ge) layer with a suitable surface orientation and in-plane surface direction.

In addition, according to the method for manufacturing a semiconductor device according to an embodiment of the present disclosure, in the ELO process, a sacrificial layer whose lattice constant is not greatly different from that of germanium (Ge) may be used to apply a strain to the germanium (Ge) layer. At this time, the applied strain means a strain in a level where just an elastic strain is applied without causing a defect in an atomic structure such as a dislocation due to plastic strain. The strain applied by the sacrificial layer is maintained on the GeOI structure after the wafer bonding and the ELO processes, and thus it is possible to improve electron and hole mobility depending on the kind of the strain. In addition, the sacrificial layer and the germanium (Ge) layer may be patterned to adjust the kind of the strain into a uniaxial strain or a biaxial strain. In particular, in case of the uniaxial strain, a longitudinal direction of the pattern may be varied, resulting in a change of the electron and hole mobility.

Further, according to the method for manufacturing a semiconductor device according to an embodiment of the present disclosure, since the GeOI structure is formed by means of the ELO process, the manufactured germanium (Ge) layer has low surface roughness and thus does not require an additional polishing process, and it is possible to manufacture the germanium (Ge) layer with a small thickness of several or several ten nanometers or below. In addition, the preform substrate used for growing the sacrificial layer may be separated after the ELO process and then reused.

DETAILED DESCRIPTION

Figure 1A:
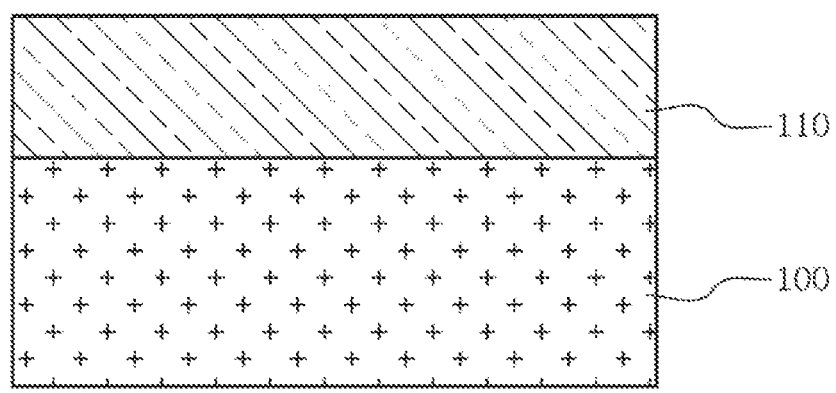
FIGS. 1A to 1C are cross-sectional views for illustrating a process of preparing a first substrate on which a germanium (Ge) layer is formed, in a method for manufacturing a semiconductor device according to an embodiment.

Hereinafter, embodiments of the present disclosure will be described in detail with reference to the accompanying drawings.

In case it is mentioned that any component is located "on" another component, the component may be located directly on another component, or any other component may be interposed between them. However, if it is mentioned that any component is located "directly on" another component, no other component is interposed between then.

Terms "first", "second", "third" or the like are used for explaining various components, ingredients, areas, layers and/or sections, without being limited thereto. These terms are just used for distinguishing any component, ingredient, area, layer or section from another. Therefore, any "first component, ingredient, area, layer or section" recited below may also be mentioned as a "second component, ingredient, area, layer or section" without departing from the scope of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the term "includes" when used in this specification, specifies the presence of stated features, regions, integers, steps, operations, elements, and/or components, but does not preclude the presence or addition of one or more other features, regions, integers, steps, operations, elements, components, and/or groups thereof.

Terms such as "above" and "below" representing relative spaces may be used for explain a relation between two components more easily on the drawings. These terms are intended to include not only features as depicted in the drawings but also features or operations in an actual use. For example, if a device is overturn on the drawing, any components which have been described as being "below" other components may be explained as being "above" other components in the overturn state. Therefore, the term "below" may include both an upper direction and a lower direction. A device may rotate by 90 degrees or another angle, and the terms representing relative spaces should be interpreted accordingly.

Unless otherwise defined, all terms including technical and scientific terms used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

According to the embodiments of the present disclosure, a germanium-on-insulator (GeOI) structure may be manufactured by means of wafer bonding and epitaxial lift-off (ELO) using an epitaxy growth structure without lattice mismatching.

Figure 1B:
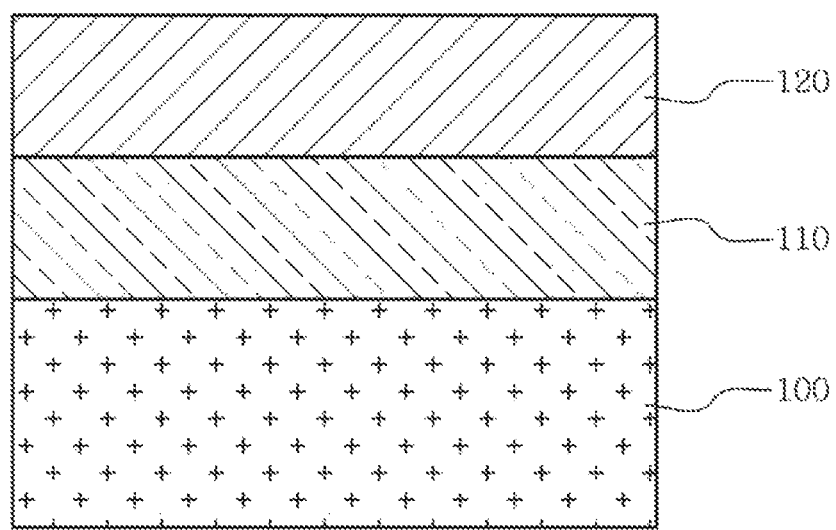
Figure 1C:
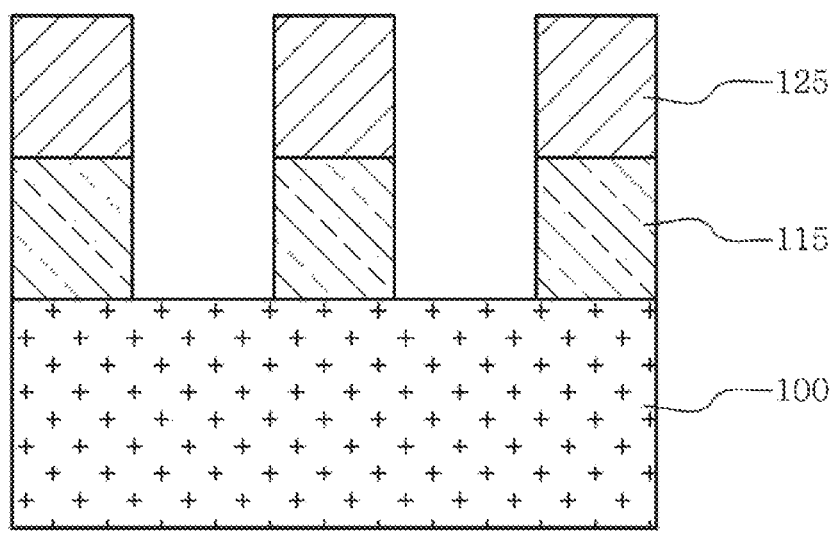

FIGS. 1A to 1C are cross-sectional views for illustrating a process of preparing a first substrate on which a germanium (Ge) layer is formed, in a method for manufacturing a semiconductor device according to an embodiment.

Referring to FIG. 1A, first, a sacrificial layer 110 may be formed on a substrate (or, also called a first substrate) 100. In an embodiment, the substrate 100 may be made of III-V compound semiconductors with an excellent electron transportation characteristic. For example, the substrate 100 may be made of gallium arsenide (GaAs) or indium phosphide (InP). In an embodiment, the sacrificial layer 110 may be formed on the substrate 100 by means of epitaxy growth.

Referring to FIG. 1B, a germanium (Ge) layer 120 may be formed on the sacrificial layer 110. Similar to the sacrificial layer 110, the germanium (Ge) layer 120 may also be formed on the sacrificial layer 110 by means of epitaxy growth. Meanwhile, the sacrificial layer 110 is made of a material whose lattice constant is different from that of germanium (Ge) by a preset threshold or below and thus whose lattice constant is close to that of the germanium (Ge). If the germanium (Ge) layer 120 is formed on the sacrificial layer 110 having such a lattice constant, a strain is applied to the germanium (Ge) layer 120 based on a difference in lattice constant between the germanium (Ge) layer 120 and the sacrificial layer 110. At this time, the applied strain means a strain in a level where just an elastic strain is applied without causing a defect in an atomic structure such as a dislocation due to plastic strain. Depending on the lattice constant of the sacrificial layer 110, the kind and degree of the strain applied to the germanium (Ge) layer 120 is determined. Namely, the lattice constant of the sacrificial layer 110 determines whether the strain is a compressive strain or a tensile strain.

Figure 2:
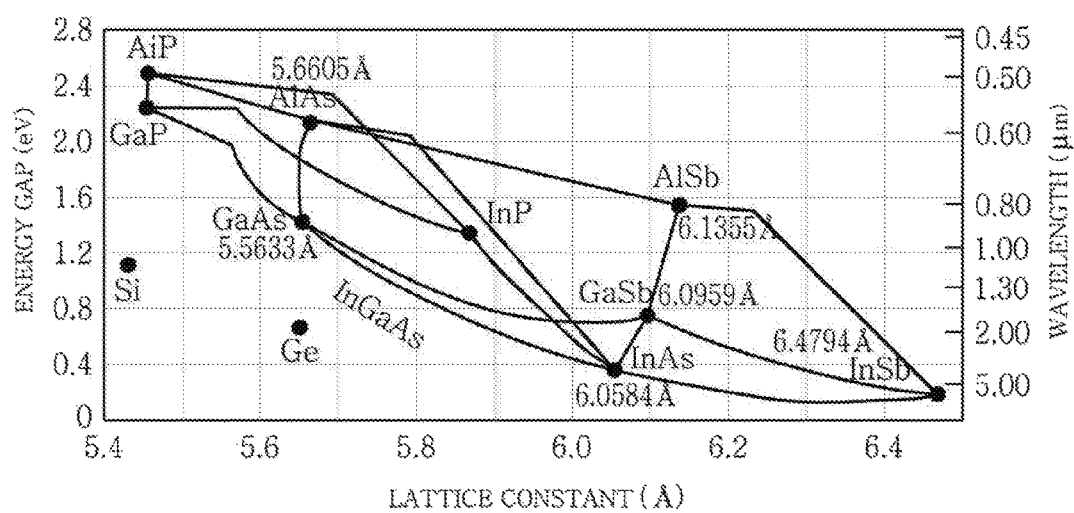
FIG. 2 is a graph showing lattice constants of various materials.

FIG. 2 is a graph showing lattice constants of various materials.

Referring to FIG. 2, aluminum phosphate (AlP), gallium phosphate (GaP), silicon (Si), indium phosphide (InP), aluminum arsenide (AlAs), aluminum gallium arsenide (AlGaAs) or the like has a lattice constant different from the lattice constant (5.64613 Å) of germanium (Ge) by about 5% or below. If a material whose lattice constant is different from that of germanium (Ge) but whose lattice constant is close to that of germanium (Ge) is used for the sacrificial layer and a germanium (Ge) layer is formed thereon as described above, a strain is applied to the germanium (Ge) layer due to the difference in lattice constant. If the lattice constant of the sacrificial layer is greater than that of germanium (Ge), a tensile strain is applied to the germanium (Ge) layer. If the lattice constant of the sacrificial layer is smaller than that of germanium (Ge), a compressive strain is applied to the germanium (Ge) layer.

At this time, the thickness of the sacrificial layer should be large enough to apply a strain to germanium (Ge), and the thickness of the germanium (Ge) layer should be so small to allow a strain to be uniformly generated. If a difference in lattice constant between the germanium (Ge) and the sacrificial layer is greater, the magnitude of strain applied to the thin germanium (Ge) layer increases. Thus, the thickness is smaller than a threshold thickness at which a plastic strain causing a defect such as dislocation in the germanium (Ge) layer occurs, so that an elastic strain should be maintained. Since the applied strain is maintained after a following ELO process, it is possible to manufacture a semiconductor device having the strained germanium (Ge) layer.

In addition, in an embodiment, the difference in lattice constant between the sacrificial layer and the germanium (Ge) may be controlled by adjusting a composition of material contained in the sacrificial layer, and further a strain applied to the germanium (Ge) layer may be controlled. For example, if the sacrificial layer is made of indium aluminum arsenide ($In_xAl_{1-x}As$), the degree of strain applied to the germanium (Ge) layer is determined depending on x. For example, if x is 0, the indium aluminum arsenide ($In_xAl_{1-x}As$) is aluminum arsenide (AlAs), and the aluminum arsenide (AlAs) has a lattice constant of about 5.6606 Å. Thus, a tensile strain corresponding to a ratio [(5.6605−5.64613)/5.6605=0.2%] of a difference in lattice constant between the sacrificial layer and the germanium (Ge) is applied to the germanium (Ge) layer. Meanwhile, for example, if x is 0.52, the indium aluminum arsenide ($In_{0.52}Al_{0.48}As$) has a lattice constant of about 5.8686 Å, and thus a strain corresponding to a ratio [(5.8686−5.64613)/5.8686=3.8%] of a difference in lattice constant between the sacrificial layer and the germanium (Ge) is applied to the germanium (Ge) layer.

Therefore, in the embodiments of the present disclosure, the material of the sacrificial layer may be a material whose lattice constant is different from that of germanium (Ge) by a preset threshold or below, and the threshold may be 5% of the lattice constant of the sacrificial layer, preferably 2% to 3% of the lattice constant of the sacrificial layer. For example, the sacrificial layer may be made of any material selected from the group consisting of aluminum phosphate (AlP), gallium phosphate (GaP), gallium aluminum phosphate (GaAlP), silicon (Si), aluminum arsenide (AlAs), gallium arsenide (GaAs), indium gallium arsenide (InGaAs), indium phosphide (InP), indium aluminum arsenide (InAlAs), and combinations of two or more thereof, and the lattice constant may be controlled to be a threshold or below by adjusting a composition ratio of the materials.

Referring to FIG. 1B again, in this embodiment, the surface orientation of the germanium (Ge) layer 120 may be suitably determined in consideration of charge mobility at the semiconductor device. For example, if the sacrificial layer 110 and the germanium (Ge) layer 120 are formed by means of epitaxy growth using the substrate 100 having a surface orientation (110), the germanium (Ge) layer 120 also has a surface orientation (110). In another case, if the sacrificial layer 110 and the germanium (Ge) layer 120 are formed by means of epitaxy growth using the substrate 100 having a surface orientation (111), the germanium (Ge) layer 120 also has a surface orientation (111). Since the germanium (Ge) has higher charge mobility at the surface orientations (110) and (111) rather than at the surface orientation (100), the performance of the semiconductor device may be maximized by forming a germanium (Ge) layer with a suitable surface orientation.

Referring to FIG. 10, in an embodiment, after the germanium (Ge) layer is formed on the sacrificial layer, the sacrificial layer and the germanium (Ge) layer are patterned before an ELO process to form the patterned sacrificial layer 115 and the patterned germanium (Ge) layer 125. The characteristic of the strain applied to the germanium (Ge) layer 125 may be controlled depending on the patterning shapes of the sacrificial layer 115 and the germanium (Ge) layer 125, as described in detail later with reference to FIGS. 5 to 6B.

Figure 3:
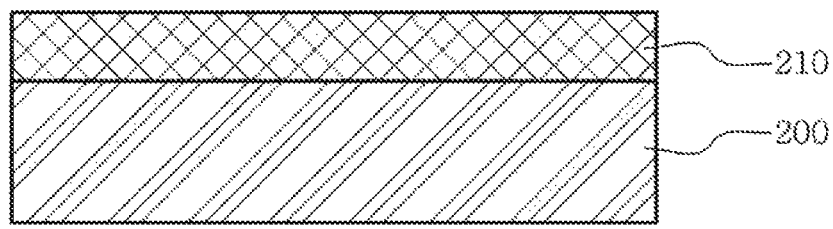
FIG. 3 is a cross-sectional view showing a second substrate on which an insulation layer is formed, in a method for manufacturing a semiconductor device according to an embodiment.

FIG. 3 is a cross-sectional view showing a second substrate on which an insulation layer is formed, in a method for manufacturing a semiconductor device according to an embodiment.

Referring to FIG. 3, a substrate 200 (or, also called a second substrate) is a substrate for forming an insulation layer 210 in a GeOI structure. For example, the substrate 200 may be made of silicon (Si), and the insulation layer 210 may be formed on the substrate 200. The insulation layer 210 may be a buried oxide layer (BOX) formed at the surface of the silicon (Si) substrate 200. However, this is just an example, and the substrate 200 may be made of a material other than silicon (Si).

Figure 4A:
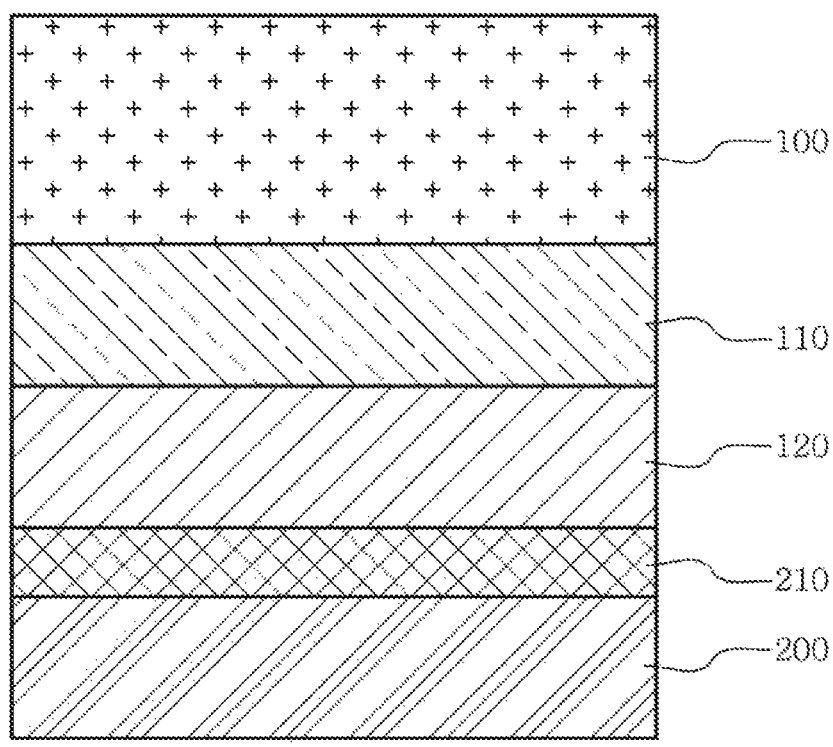
FIGS. 4A to 4C are cross-sectional views for illustrating a process of transferring a germanium (Ge) layer, in a method for manufacturing a semiconductor device according to an embodiment.
Figure 4B:
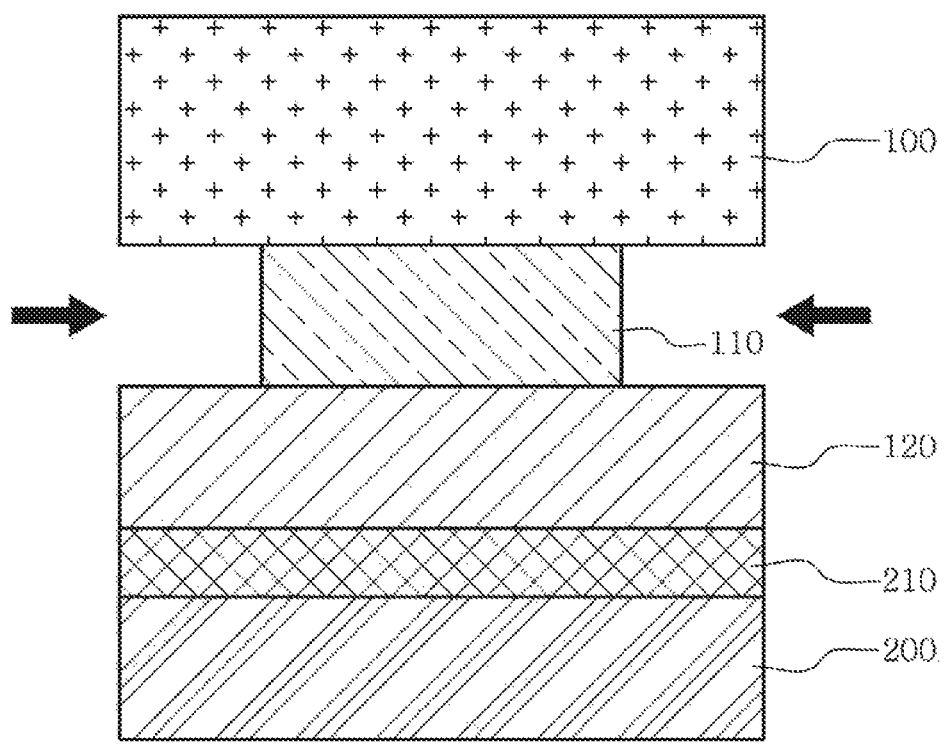
Figure 4C:
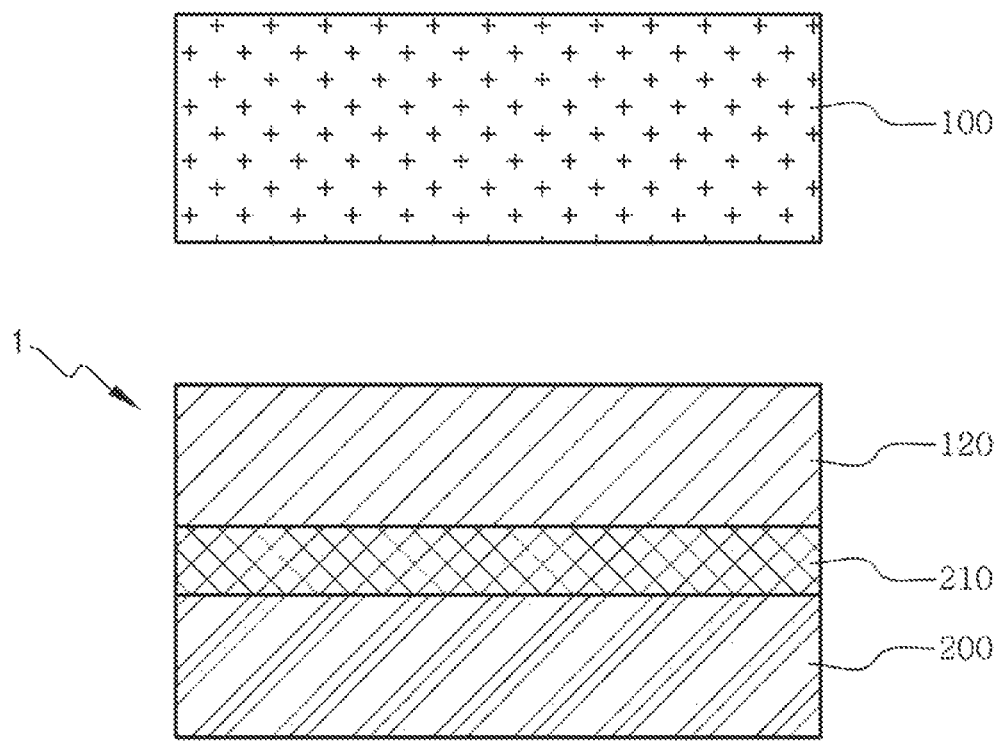

FIGS. 4A to 4C are cross-sectional views for illustrating a process of transferring a germanium (Ge) layer, in a method for manufacturing a semiconductor device according to an embodiment.

Referring to FIG. 4A, after the first substrate 100, the sacrificial layer 110 and the germanium (Ge) layer 120 are formed as in FIG. 1B, the germanium (Ge) layer 120 may be bonded to the insulation layer 210 on the second substrate 200 as shown in FIG. 3. The bonding may be performed by means of a common wafer-bonding technique. In an embodiment, before the bonding, a process of removing a native oxide film formed on the germanium (Ge) layer 120 and/or the insulation layer 210 is further performed. Alternatively, before the bonding, an insulation layer (not illustrated) may be formed on the germanium (Ge) layer 120 and this insulation layer may be bonded to the insulation layer 210. For example, the insulation layer on the germanium (Ge) layer 120 may be made of the same kind of oxide as the insulation layer 210 on the second substrate. Also, in an embodiment, before the bonding, the surface of the germanium (Ge) layer 120 and/or the insulation layer 210 is treated with plasma for activation.

Referring to FIG. 4B, in a state where the germanium (Ge) layer 120 is bonded to the insulation layer 210, the sacrificial layer 110 is etched by means of epitaxial lift-off (ELO). The etching process is performed while adjusting selectivity of an etching solution so that the germanium (Ge) layer 120 is not etched while the sacrificial layer 110 is being rapidly etched. The etching solution used for etching the sacrificial layer 110 may be a hydrophilic solution containing hydrogen fluoride (HF), for example a solution in which hydrogen fluoride (HF) and deionized water (DIW) are mixed at a predetermined ratio. In addition, in an embodiment, the etching solution may further include isopropyl alcohol (IPA) and/or acetone for suppressing gas bubbling.

If the sacrificial layer 110 is entirely removed, the first substrate 100 is separated, thereby completing the ELO process, and then a semiconductor device 1 with a GeOI is obtained as shown in FIG. 4C.

Figure 5:
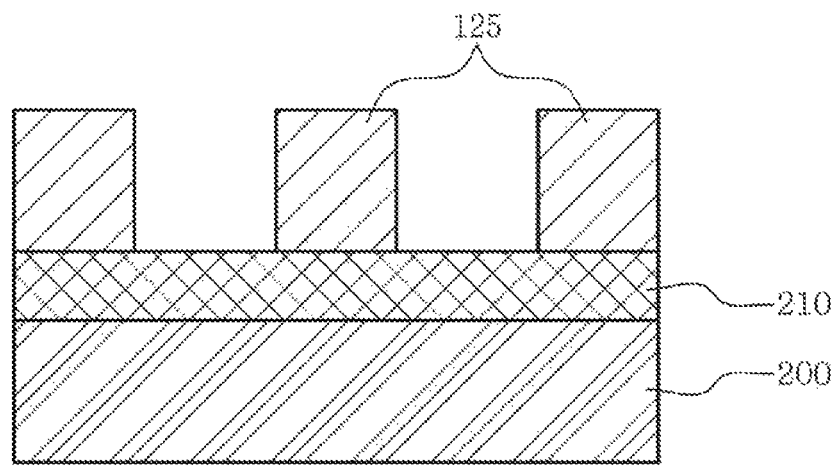
FIG. 5 is a cross-sectional view showing a semiconductor device manufactured according to another embodiment.

FIG. 5 is a cross-sectional view showing a semiconductor device manufactured according to another embodiment.

Even though the sacrificial layer and the germanium (Ge) layer are patterned into a predetermined shape before the ELO process as in the former embodiment depicted in FIG. 10, the transferring process by etching the sacrificial layer as described above with reference to FIGS. 4A to 4C may be performed in the same way. As a result, as shown in FIG. 5, a semiconductor device with a GeOI structure in which the patterned germanium (Ge) layer 125 is transferred onto the insulator 210 on the second substrate 200 may be obtained.

Figure 6A:
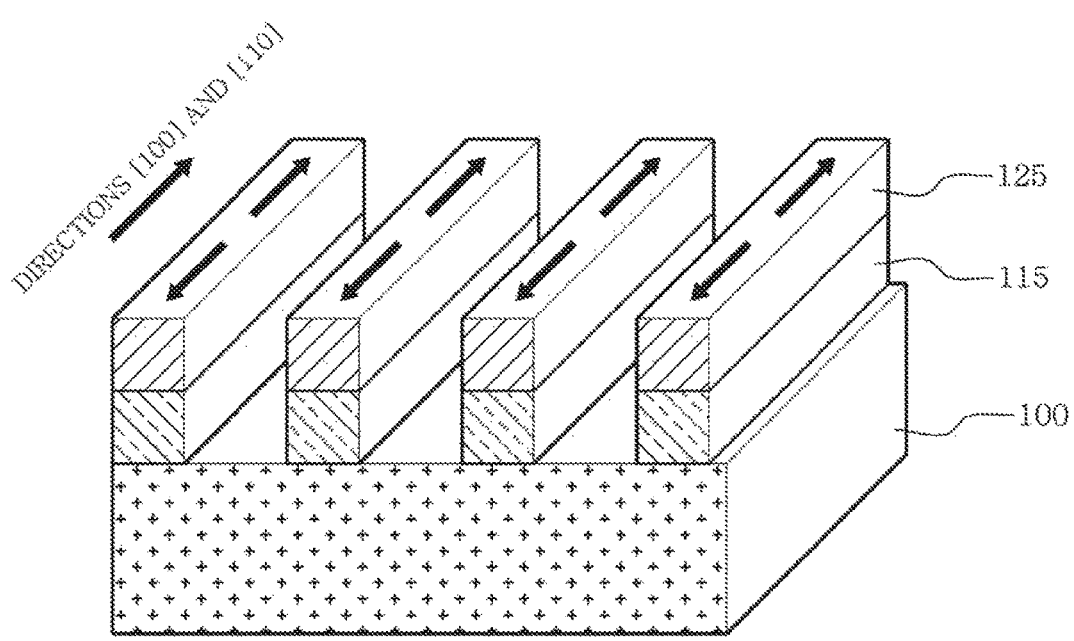
FIGS. 6A and 6B are perspective views showing patterning shapes of a sacrificial layer and a germanium (Ge) layer, in a method for manufacturing a semiconductor device according to embodiments.
Figure 6B:
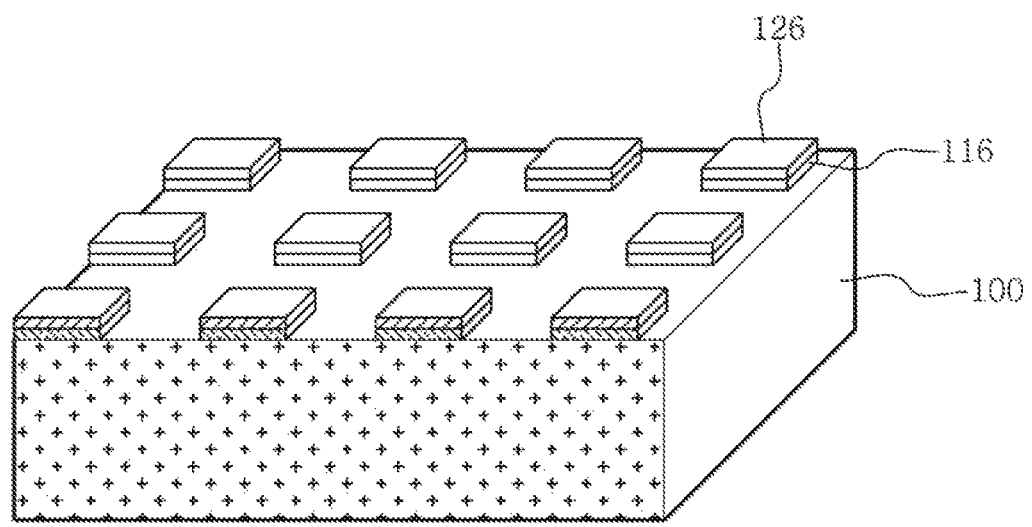

FIGS. 6A and 6B are perspective views showing patterning shapes of a sacrificial layer and a germanium (Ge) layer, in a method for manufacturing a semiconductor device according to embodiments.

Referring to FIG. 6A, in an embodiment, the sacrificial layer 115 and the germanium (Ge) layer 125 are patterned into a plurality of stripe shapes extending in one direction. In this case, a uniaxial strain is applied to the germanium (Ge) layer 125. In other case, referring to FIG. 6B, in an embodiment, the sacrificial layer 116 and the germanium (Ge) layer 126 are patterned into a shape with a plurality of square shaped patterns arranged in a two-dimensional array, for example into a shape where rectangular patterns are arranged to be spaced apart from each other in x-axis and y-axis directions on an x-y plane. In this case, a biaxial strain is applied to the germanium (Ge) layer 126.

Since the electron and hole mobility at the germanium (Ge) layer 125 varies depending on the kind of strain, the strain of the germanium (Ge) layer 125 may be controlled by means of a suitable pattern. In particular, when a uniaxial strain is applied, the electron and hole mobility varies in a longitudinal direction of the pattern, and thus by using this, the patterning direction of the germanium (Ge) layer 125 may be suitably determined. For example, the germanium (Ge) layer 125 may be patterned into a plurality of stripe shapes extending in a lattice direction [100] or [110] to enhance electron and hole mobility. In addition, different in-plane directions may be available depending on the surface orientations (100), (110), (111) of the germanium (Ge) layer. The characteristic of strain may be controlled in a uniaxial or biaxial way in both cases where a compressive strain is applied to the germanium (Ge) layer and a tensile strain is applied thereto.

While the exemplary embodiments have been shown and described, it will be understood by those skilled in the art that various modifications in form and details may be made thereto without departing from the scope of the present disclosure as defined by the appended claims. However, such modifications should be regarded as falling within the scope of the present disclosure. Therefore, the true scope of the present disclosure should be defined by the appended claims.

What is claimed is:

1. A method for manufacturing a semiconductor device, the method comprising:

forming a sacrificial layer on a first substrate, the sacrificial layer being made of a material whose lattice constant is different from a lattice constant of germanium (Ge) by about 0.2% to about 5% in absolute value;

forming a germanium (Ge) layer on the sacrificial layer such that the sacrificial layer is disposed between the first substrate and the germanium (Ge) layer and a strain as a result of the difference in lattice constant between the germanium (Ge) layer and the sacrificial layer is applied to the germanium (Ge) layer;

forming an insulation layer on a second substrate;

bonding the germanium (Ge) layer formed on the sacrificial layer onto the insulation layer; and selectively etching the sacrificial layer to concurrently remove the sacrificial layer and the first substrate from the germanium (Ge) layer, wherein the strain is maintained in the germanium (Ge) layer after the removing of the sacrificial layer.

2. The method for manufacturing a semiconductor device according to claim 1, wherein the sacrificial layer includes any material selected from the group consisting of aluminum phosphate (AlP), gallium phosphate (GaP), gallium aluminum phosphate (GaAlP), silicon (Si), aluminum arsenide (AlAs), gallium arsenide (GaAs), indium gallium arsenide (InGaAs), indium phosphide (InP), indium aluminum arsenide (InAlAs), and combinations of two or more thereof.

3. The method for manufacturing a semiconductor device according to claim 2, wherein the sacrificial layer is made of indium aluminum arsenide (InAlAs), and
wherein a magnitude of the strain applied to the germanium (Ge) layer is determined according to compositions of indium (In) and aluminum (Al) in the sacrificial layer.

4. The method for manufacturing a semiconductor device according to claim 1, further comprising:
patterning the sacrificial layer and the germanium (Ge) layer into a predetermined shape before bonding the germanium (Ge) layer onto the insulation layer.

5. The method for manufacturing a semiconductor device according to claim 4, wherein the predetermined shape has a plurality of strip shapes extending in one direction, and a uniaxial strain is applied to the germanium (Ge) layer.

6. The method for manufacturing a semiconductor device according to claim 4, wherein the predetermined shape has a plurality of square shaped patterns arranged in a two-dimensional array, and a biaxial strain is applied to the germanium (Ge) layer.

7. The method for manufacturing a semiconductor device according to claim 1, wherein the first substrate is made of III-V compound semiconductors, and
wherein the sacrificial layer is formed on the first substrate by means of epitaxy growth.

8. The method for manufacturing a semiconductor device according to claim 7, wherein the first substrate contains indium phosphide (InP).

9. The method for manufacturing a semiconductor device according to claim 1, wherein the second substrate is made of silicon.

* * * * *